United States Patent [19]

Shlichta

[11] Patent Number: 4,517,048
[45] Date of Patent: May 14, 1985

[54] METHOD FOR MINIMIZING CONVECTION DURING CRYSTAL GROWTH FROM SOLUTION

[75] Inventor: Paul J. Shlichta, San Pedro, Calif.

[73] Assignee: The United States of America as represented by the Administrator of the National Aeronautics and Space Administration, Washington, D.C.

[21] Appl. No.: 547,175

[22] Filed: Oct. 31, 1983

[51] Int. Cl.$^3$ .............................................. C30B 19/02
[52] U.S. Cl. ............................ 156/621; 156/DIG. 72; 156/DIG. 83; 422/245
[58] Field of Search ............... 156/619, 621, 622, 624, 156/DIG. 72, DIG. 83; 422/245

[56] References Cited

U.S. PATENT DOCUMENTS 3,124,489  3/1964  Vogel, Jr. et al. .................. 156/608

FOREIGN PATENT DOCUMENTS 425420  8/1982  U.S.S.R. .............................. 156/621

OTHER PUBLICATIONS

H. Collan, A Simple Method for Growing Single Crystals for Magnetic Cooling Experiments, Cryogenics, Jun. 1969, p. 215.

Primary Examiner—David L. Lacey
Attorney, Agent, or Firm—Paul F. McCaul; John Manning; Thomas H. Jones

[57] ABSTRACT

Disclosed is a method and apparatus for growing in a gravitational field a microscopic crystal from a solution. Solution is held in a vertical chamber which is relatively thin, the thin dimension being generally perpendicular to the vertical. There is a substrate crystal disposed at either the upper or lower end of the chamber and the crystal grows from this substrate crystal in one direction. In accordance with this invention, the temperature conditions of the solution are controlled so that as the crystal forms the effects of buoyant convection within the solution are minimized. This is accomplished in two different ways depending upon whether the crystal is grown from the upper or lower end of the chamber. When grown from the upper end of the chamber, the temperature of the solution is controlled so that it remains essentially isothermal so that there is essentially no heat loss from the solution. When the crystal is grown from the lower end of the chamber, the temperatures of the solution is controlled so that there is a differential in temperature throughout the solution which provides a positive thermal gradient within the chamber.

10 Claims, 4 Drawing Figures

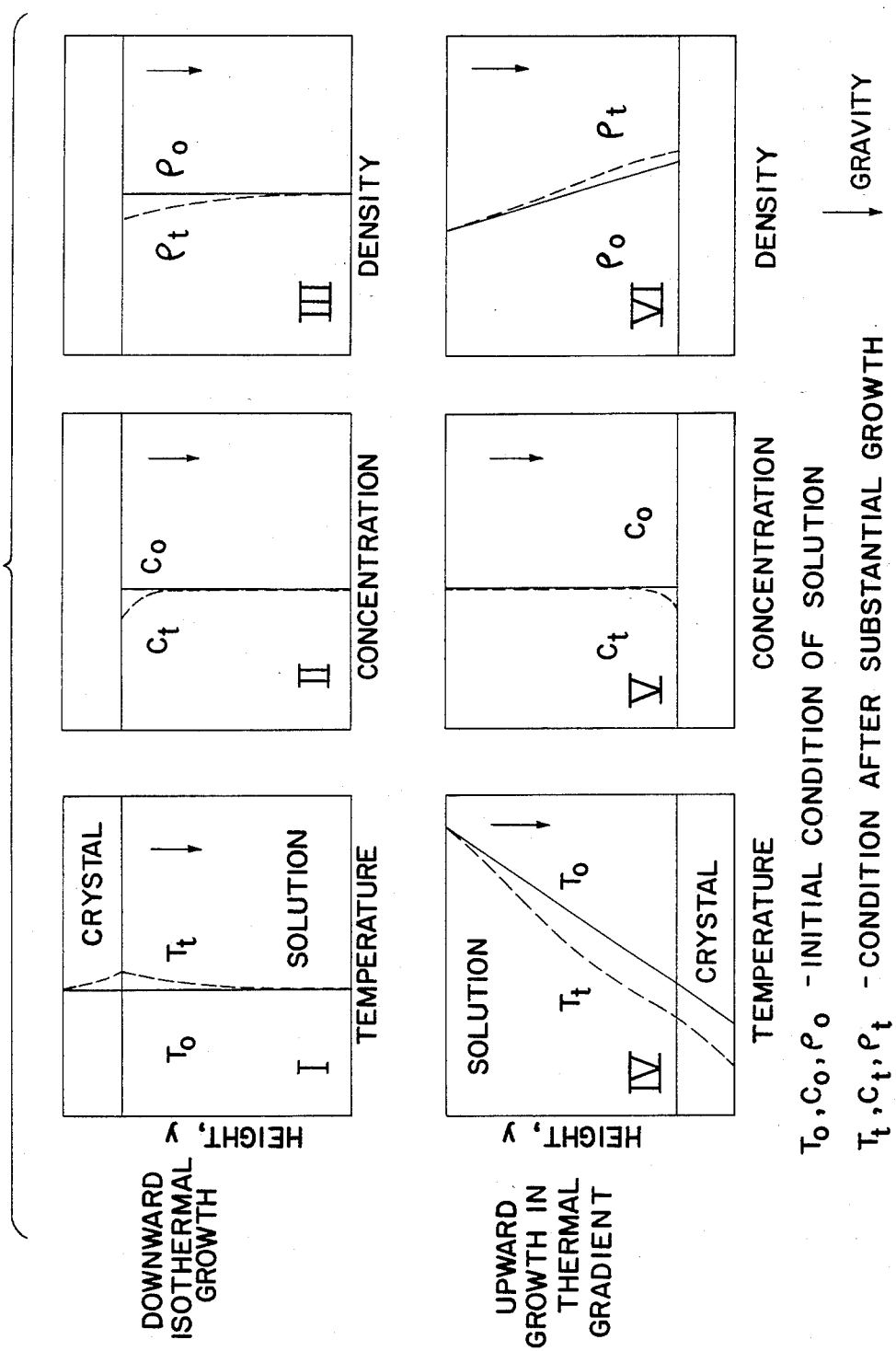

METHOD FOR MINIMIZING CONVECTION DURING CRYSTAL GROWTH FROM SOLUTION

BACKGROUND OF THE INVENTION

1. Origin of the Invention

The invention described herein was made in the performance of work under a NASA Contract and is subject to the provisions of Section 305 of the National Aeronautics and Space Act of 1958, Public Law 85-568 (72 STAT 435; 43 USC 2457).

2. Field of the Invention

This invention relates to a method and apparatus for growing in a gravitational field a crystal from solution where buoyant convection is minimized. In particular it relates to a method and apparatus for growing crystals wherein the crystals are grown from either the upper or lower end of a generally vertical, shallow, chamber under temperature conditions that minimize the effects of buoyant convection.

3. Background Discussion

Solid materials may be dissolved in a liquid and, as the temperature of the solution is reduced under controlled conditions, the solid materials precipitate from the solution as a single crystal. In a gravitational field such crystallization is normally accompanied by buoyant convection caused by density gradients in the solution near the crystal being formed. Thus the less dense or lighter portions of the solution float upwardly and the denser or heavier portions of the solution move downwardly. These density gradients are the results of differences in solute concentration within the solution surrounding the crystal. As solute is depleted with crystal growth, these concentration differences cannot be avoided.

There also exist temperature differences within the solution surrounding the crystal which may also produce buoyant convection. These are of secondary importance, but nevertheless must be taken into account. Since density is a function of both concentration and temperature, such temperature gradients may thus produce buoyant convection, but to a far less degree than concentration gradients.

Buoyant convection interferes with researchers' study of the mechanism of the crystal growth process. Specifically, it interferes with the measurement of temperature in concentration gradients as a function of the rate of growth. Many researchers believe that convection is also linked to or causes the formation of liquid inclusions in the crystal being formed, which is a highly undesirable result. Superior crystals which avoid such liquid inclusions may be made under zero gravity conditions provided by spaceflight. Other crystal properties, such as purity, may also be substantially improved when buoyant convection is eliminated by the absence of gravity.

In a gravitational field, buoyant convection has only been eliminated in growing microscopic crystals, that is, crystals that can only be seen under a microscope. These microscopic crystals are of no practical value. Macroscopic crystals, those observable with the naked eye, have been grown without subjecting the crystals to buoyant convection by employing forced convection. This is accomplished by creating, under controlled conditions, currents within the solution that have a known flow pattern. For example, by stirring the solution in a prescribed way using a mounting holding the crystal. This forced convection overwhelms and mitigates the effects of buoyant convection. Creating forced convection is, however, a complex procedure, and the desired results are not always obtained.

Thus, a simple method and apparatus has long been desired which provides minimum buoyant convection in a gravitational field for growing a macroscopic crystal, thereby avoiding the need to grow crystals in a zero gravity environment. This invention also finds utility in a spaceflight environment which under current conditions still has a residual gravity field and transient acceleration that produces buoyant convection.

SUMMARY OF THE INVENTION

This invention provides a simplified method and apparatus for minimizing buoyant convection during crystal growth from solution in the presence of a gravitational field. The central feature of this invention is to establish conditions within a chamber where a macroscopic crystal is grown so that the density gradients caused by concentration changes within the solution due to crystal growth are offset to avoid or minimize buoyant convection. Specific conditions are: (a) the chamber in which the macroscopic crystal is grown is generally boxlike, but very shallow in the depth dimension, so that crystal growth is essentially unidirectional along the vertical, (b) the temperature of the solution is controlled to either alter the density gradient within the solution or offset the secondary effects of density gradients due to temperature changes produced by crystallization, and (c) the cooling rate of the solution is slow, typically less than 1° C. per hour.

In broad terms, the method comprises the steps of:

(a) holding the solution in a vertical chamber which is relatively thin, this thin dimension being generally perpendicular to the vertical, (b) disposing in the chamber at one end a substrate crystal from which the crystal grows, and (c) controlling the temperature conditions in the solution so that the crystal forms, and as the crystal forms, the effects of buoyant convection within the solution are minimized.

The design of the chamber is critical for the practice of the method of this invention. The chamber has a generally boxlike internal configuration with the depth of the chamber being relatively shallow. In general, this depth should not be greater than about 8 millimeters. This type of chamber will produce a crystal which is relatively thin but of sufficient height and width so that it will constitute a macroscopic crystal.

In accordance with an important feature of this invention, the substrate crystal is disposed along essentially the entire upper or entire lower end of the chamber. The macroscopic crystal grows outwardly from the substrate crystal, generally in a single plane in one direction along the vertical axis of the chamber. The use of such a thin chamber restricts the direction of buoyant convection to a plane perpendicular to the thin dimension. This greatly facilitates the suppression of secondary convection due to thermal gradients as described below.

When the crystal is disposed at the upper end of the chamber, the temperature of the solution is maintained essentially isothermal. This will offset any of the secondary effects of density changes due to fluctuations in temperature. As the crystal grows downwardly from the upper end of the chamber, the natural conditions occurring within the solution in the chamber provide a less dense or lighter solution overlying a denser or heavier solution. Under these conditions there is no tendency for buoyant convection to occur, since the lighter solution is above the heavier solution. It is when this condition is reversed, that is, heavier solution over lighter solution that buoyant convection occurs.

When the crystal is grown from the lower end upwardly, the temperature conditions are adjusted so that the temperature of the solution in the upper portions of the chamber is substantially higher than the temperature of the solution at the interface where crystal growth occurs. Because of this temperature differential, even though the solution in the upper portions of the chamber would under isothermal conditions be heavier than solution at the interface, the decrease of solution temperature with increasing temperature offsets this and produces a less dense solution in the upper portions of the chamber even though the concentration of solute in the upper portions is substantially higher than at the interface. This condition is referred to herein as a "positive thermal gradient." That is, the temperature of the solution increases with distance from the interface where crystal growth occurs so that the density of the solution in the upper regions of the chamber is less than in the lower regions. Typically, this temperature difference may be as high as 30° C. or higher.

In accordance with another aspect of this invention, an apparatus is provided for carrying out the method of this invention. This apparatus includes a pair of conductive blocks holding space insulating plates, for example, glass window panes. The blocks and plates are arranged to provide the chamber, which has a generally boxlike interior. The depth dimension of the chamber is generally perpendicular to the vertical and is substantially less than the other dimensions of the chamber. The blocks have within them channels through which a thermal fluid is circulated. Temperature sensors are employed, one to measure the temperature of the thermal fluid, the other to measure the temperature of the solution within the chamber. Means connected to the temperature sensors provide control of the temperature of the solution. This apparatus may be used to grow crystals from either the upper or lower end of the chamber.

BRIEF DESCRIPTION OF THE DRAWINGS

The features of the present invention can best be understood by reference to the following description taken in connection with the drawing where like numerals indicate like parts.

FIG. 4 is two series of graphs, one of which depicts what occurs during downward growth of the crystal and the other of which depicts upward growth of the crystal.

DETAILED DESCRIPTION OF THE DRAWINGS

Apparatus

Figure 1:
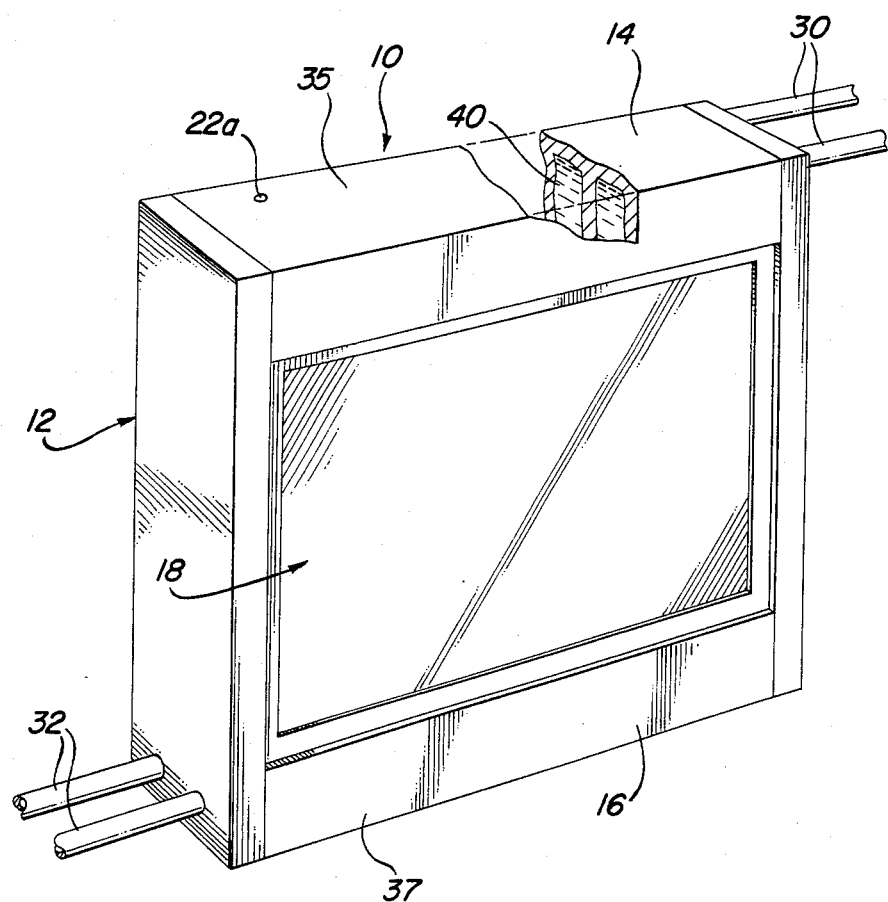
FIG. 1 is a perspective view of the crystallization cell of the apparatus of this invention.
Figure 2:
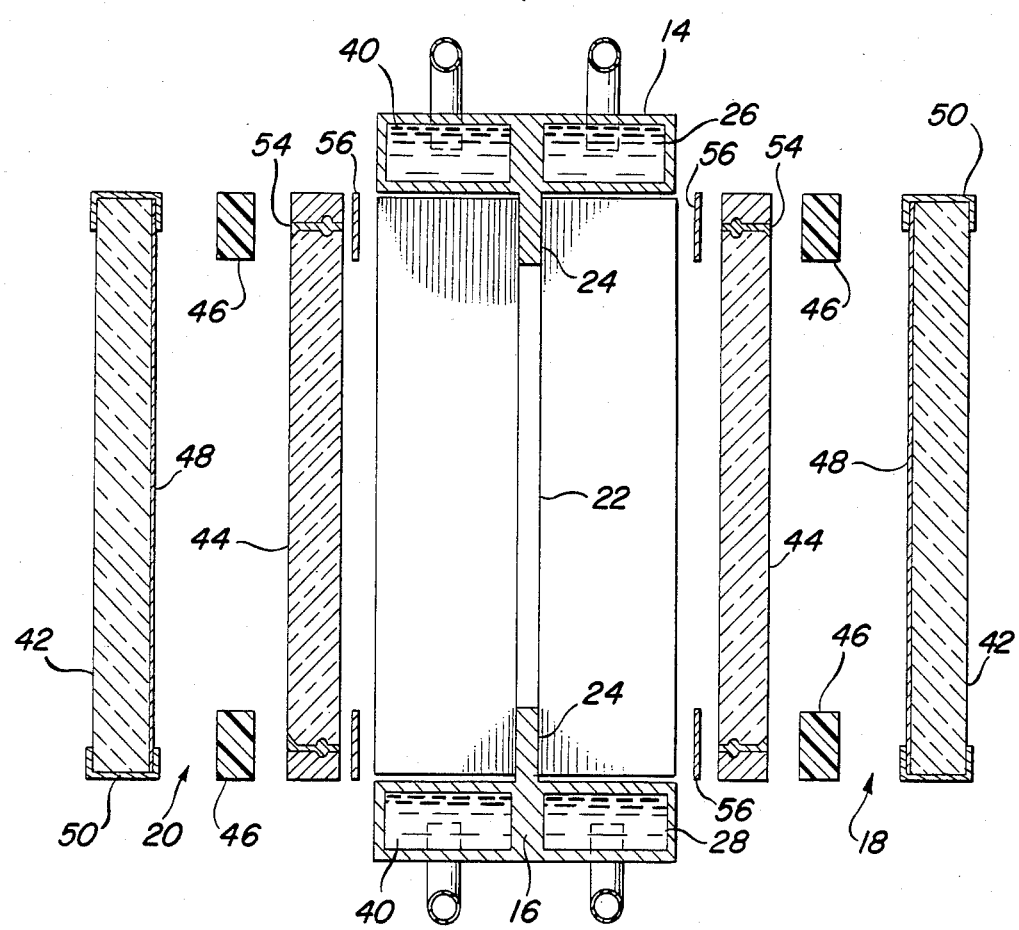
FIG. 2 is an exploded view, in cross-section, of the crystallization cell employed in the apparatus of this invention.
Figure 3:
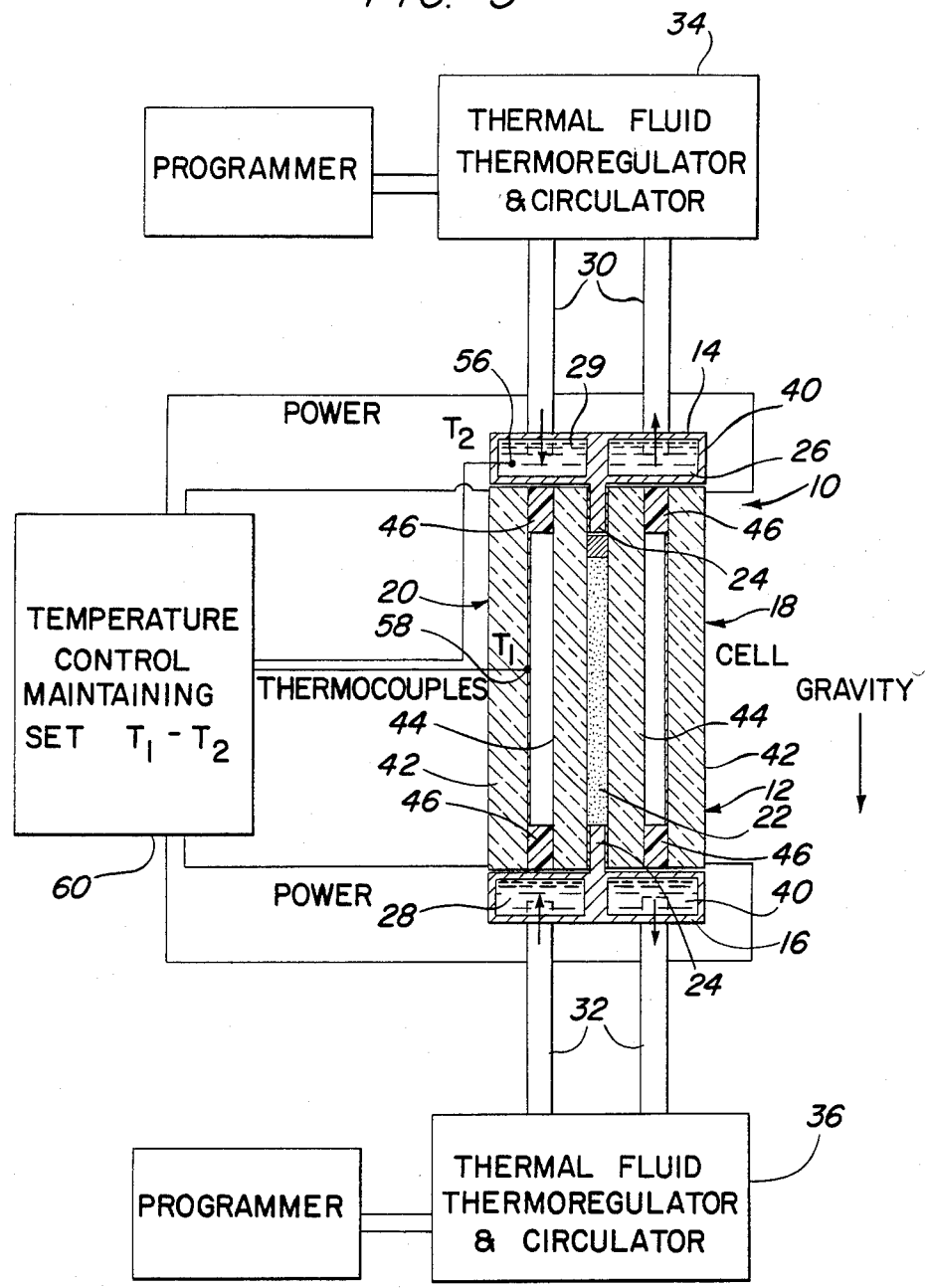
FIG. 3 is a schematic diagram of the apparatus of this invention.

FIGS. 1 through 3 show the apparatus 10 of this invention for growing crystals in a normal gravitational field. As best shown in FIG. 3, the apparatus 10 employs a crystal growing cell 12 which includes a pair of spaced-apart copper or aluminum blocks 14 and 16 which retain "thermal pane" type windows 18 and 20. The space between the blocks 14 and 16 and windows 18 and 20 form the crystal growing chamber 22. The chamber 22 is so designed that it is a relatively thin chamber so that unidirectional planar crystal growth occurs within it. Each block 14 and 16 includes an inwardly pointing fin 24 which defines the depth of the chamber, with these fins separating the windows. Each block 14 and 16 also includes U-shaped channels 26 and 28, respectively, with a pair of conduits 30 and 32 extending from opposed ends of the channels. Conduits 30 and 32 extend outwardly from, respectively, blocks 14 and 16, and place the channels in communication with thermal fluid circulators 34 and 36, respectively. These circulators include heaters (not shown) for adjusting the temperature of the thermal fluid. A pump (not shown) in the circulators 34 and 36 pumps thermal fluid 29 through the conduits 30 and 32 into and out of the channels 26 and 28 in each block. The sides 35 and 37 (FIG. 1) of the cell 12 may be insulated and equipped with auxiliary heaters.

As best shown in FIG. 2, each window 18 and 20 comprises two plates 42 and 44 of glass which are spaced apart by means of a pair of Lucite spacers 46. The outer plates 42 are held in nickel-plated steel frames 50. At the edges of the inner plates 44 is an epoxy seal 54. A paraffin gasket 56 is provided between the inner window and the edges of the blocks 14 and 16 and serves as a seal. The outer plate 42 of glass has its inside surface coated with a transparent conductive film 48. This film may include several separate segments each maintained at a different temperature than the others. This would be the case when the macroscopic crystal is grown from the lower end of the chamber 22. The outer plates are held in electrically conductive frames 50.

As shown in FIG. 1, when assembled, the outer and inner plates 42 and 44 of each window provide a thermal pane type of structure. The inner plates abut the fins 24, and the fins 24 serve as spacers defining the smallest dimension of the chamber 22. This smallest dimension is generally perpendicular to the vertical growth direction of the crystal in the chamber 22. The assembled structure will provide a crystallization cell 12 providing a chamber 22 having a boxlike interior. The typical dimensions of the chamber 22 are 75×75×4 millimeters.

As shown in FIG. 3, two thermocouples 56 and 58 are disposed in the cell 12. One is disposed in the channel 26 of the upper block 14 and the other is disposed adjacent the inside surface of the outer glass plate 44. These two thermocouples 56 and 58, serving as temperature sensors, are connected to a temperature controller 60. This controller 60 regulates the current flowing into the film 48 covering the surface of one of the plates 42.

The cell 12 of the above design provides a "thin" chamber 22 for holding the solution from which the crystal is grown. This chamber design "two dimensionalizes" the convection pattern within the cell 12 and the thermal pane type windows 18 and 20 minimize the heat flow from or into the chamber 22. The thermal fluid temperature is regulated to provide the desired temperature conditions within the chamber 22 for crystal growth 22.

Method

The apparatus 10 is used to carry out the method of this invention for growing macroscopic crystals with minimum buoyant convection. In accordance with the method of this invention, the crystal may be grown from either the upper end of chamber 22 or the lower end of chamber 22. As shown in FIG. 1, the solution containing the crystal material is introduced into the chamber 22 by means of a hypodermic needle (not shown) which is inserted through a small diameter hole 22(a) in the block 14.

When the crystal is grown from the top down, a substrate crystal is first mounted on the edge of the upper fin 24 prior to assembly of the apparatus. Next, the solution is introduced into the chamber 22 at a temperature which avoids dissolving the substrate crystal, and the circulators are programmed so that there is essentially no temperature difference between the thermal fluid flowing through the upper and lower blocks 14 and 16. Since conditions are not at a steady state, this must be taken into account. Thus, the temperature control for the transparent film 48 is set so that the difference in temperature between the window and the thermal fluid flowing through the upper block will provide a higher temperature at the surface of the windows 18 and 20 than the solution of the material in the chamber. Consequently, enough heat is introduced into the chamber to compensate for heat losses. Thus, these windows will act as quasi-adiabatic windows and prevent the flow of heat either into or from the chamber 22.

As crystal grows downwardly in a vertical direction, solute material in the solution is removed, thus lowering the temperature at the interface between the solid crystal and the solution. Because of the essentially isothermal temperature conditions being maintained, however, this tends to suppress any convection which would otherwise occur. As the crystal grows downwardly, these convection currents are continued to be suppressed or minimized, thus avoiding the adverse consequences of convection during crystal formation due to temperature differences.

In accordance with the alternate embodiment of this method, the crystal is grown from the bottom of the chamber upwardly in a vertical direction. In a similar manner the chamber is precharged with solution and the substrate crystal is mounted on the edge of the lower fin 24. In this instance, however, the temperature of the thermal fluid flowing through the upper block is substantially higher than the temperature of the thermal fluid flowing through the lower block. Again, the temperature of the windows is maintained under conditions which prevent the flow of heat from the chamber outwardly through these windows. As solute material is removed from the solution with the formation of crystal, the density of the solution at the interface between the solid crystal and the solution decreases. However, since the temperature of the solution above the interface zone is higher, the density of this solution is less than or equal to the density of material at the interface. Temperature conditions are adjusted and the circulators are programmed so that such a positive thermal gradient is maintained continually throughout the course of the formation of the crystal. This temperature condition is adjusted carefully so that the density of the solution in the upper part of the chamber 22 is always slightly lower than or equal to the density of the solution at the interface.

FIG. 4 illustrates graphically the temperature, concentration, and density conditions under both downward isothermal growth and upward growth in a positive thermal gradient. The symbols $T_o$, $C_o$, $\rho_o$, respectively, indicate the temperature, concentration, and density conditions at startup. The symbols $T_t$, $C_t$, $\rho_t$, indicate respectively, temperature concentration and density conditions after substantial growth of the crystal.

The three graphs marked respectively as I, II and III depict respectively the temperature, concentration, and density conditions of the crystal during downward isothermal growth. As illustrated in Graph I, the initial temperature condition $T_o$ is measured along the vertical axis of the chamber designated as y. Thus, there is initially an essentially uniform temperature throughout the entire height of the solution in the chamber 22. As the crystal begins to grow, there is in this case a slight change in temperature as the crystal forms in the upper part of the chamber. Referring to Graph II, there is initially a uniform concentration of solute in the solution which, as the crystal grows, decreases at the interface between the solution and the crystal. This decrease in solute concentration would produce a condition where a lighter solution would overlay a heavier solution. This condition is depicted in Graph III. Under these conditions buoyant convection will be eliminated or minimized. Thus, growth of the crystal in the downward vertical direction inherently produces conditions which minimize buoyant convection. Again, because the chamber is relatively thin, the growth is unidirectional downwardly in a vertical direction along the entire width of the substrate crystal disposed at the upper end of the chamber 22.

The conditions prevalent when the macroscopic crystal is grown from the bottom end of the chamber are depicted by the Graphs IV, V and VI. As the crystal is grown from the bottom up, the thermal gradient along the vertical axis of the chamber 22 is adjusted so that the temperature of the solution will gradually increase. Accordingly, the uppermost portion of solution is at the highest temperature and the lowermost portion of the solution interfacing the crystal is at the lowest temperature. As the interface is cooled to promote crystal growth, the temperature differential will increase as indicated by the dashed line. As depicted in Graph V, the initial concentration of the solute in the solution is uniform throughout the entire solution. When crystal begins to form, this concentration decreases as indicated by the dashed line. A decrease in concentration would mean that a lighter or less dense solution is underlying a more dense or heavier solution. This would normally create buoyant convection. However, because of the thermal gradient applied along the vertical axis of the chamber, the temperature of the solution in the upper portions of the chamber is substantially higher than those in the lower portions of the chamber, producing in effect a lowered density solution overlying a less dense solution. This is illustrated in Graph VI, which shows the initial density in solid lines and the density after substantial growth of the crystal in dashed lines. Note that the least dense solution overlies the more dense solution. This density gradient suppresses buoyant convection. Moreover, it is believed that growing a crystal into a solution which is at a higher temperature than at the interface provides improved crystal properties.

Experimentally, three different materials were used to form crystals in accordance with the method of this invention. The materials used were potassium bromide, aluminum potassium sulfate, and potassium dihydrogen phosphate. These materials were dissolved in water to form the solution and crystals were then grown from this solution in accordance with the methods discussed above. Tables 1 and 2 set forth the data collected in carrying out the experiments for two different cells denominated UGC3 and UGC4. The initials UGC indicate "Unit Directional Growth cell," which, quite obviously, is the manner by which crystals are grown in accordance with this invention. The difference between the two cells consists in structural and operational differences in the frame structure. Each cell, however, operates in accordance with the novel principles of my invention.

TABLE I

Isothermal mode experiments[a]

| EXPERIMENT # | CRYSTAL | $T_{sat}$ | $T_{cell}$ | COOLING RATE | TIME | MODES OF OBSERVAT. | ONSET OF CONVECT. |
|---|---|---|---|---|---|---|---|
| 233-38 | Kbr(100) | 50° C. | 50–40° C. | 0.42° C./hr. | 25 hr | S | 48° |
| 948-26 | Alum(111) | " | 50–43 | " | 17 | SM | none |
| 948-43 | " | " | 50–41 | " | 21 | SM | " |
| 948-64 | " | " | 50 | " | 10 | SM | " |
| 948-72 | " | " | 50–40 | " | 23 | SM | " |
| 948-75 | " | " | 50–42 | " | 19 | SM | " |
| 951-3 | " | " | 50–41 | " | 21 | SM, CM | |
| 953-15 | " | " | 53–42 | " | 20 | SM, CM | |
| 948-86 | KDP(001) | 47° | 47–27 | " | 47 | SM | none |
| 948-96 | KDP(100) | 49 | 49–39 | " | 24 | SM, CM | Intermit. at onset |
| 953-11 | " | " | 49–39 | " | 24 | SM, CM | |

| EXPERIMENT # | T | TOTAL GROWTH | INTERFACE PROFILE | SURFACE TEXTURE | LAYERS | INCLUSIONS |
|---|---|---|---|---|---|---|
| 233-38 | 48° C. | | CRYSTAL NOT SAVED FOR STUDY | | | |
| 948-26 | 49° | | | " | | |
| 948-43 | 49° | | | " | | |
| 948-64 | 50°[b] | | | " | | |
| 948-72 | 49° | | | " | | |
| 948-75 | 49° | | | " | | |
| 951-3 | | 0.8 mm | flat[c] | facet | clear, few | no |
| 953-15 | | 0.5 | flat[c] | facet | clear, few | yes |
| 948-86 | none | 0.6 | slightly convex[c] | caps & pits | | |
| 948-96 | 45° | 0.3 | flat[c] | facet[d] | clear | |
| 953-11 | | 0.2 | concave[c] | stepped | clear | no |

NOTES:
[a]All experiments were carried out in the UGC4 cell with the top 0.5° C. hotter than the body throughout.
[b]Crystallite fell from seed crystal during filling with solution.
[c]Facet along edge of crystal.
[d]Plateau above location of spurious crystals.

TABLE II

Gradient mode experiments[a]

| EXPERIMENT # | CRYSTAL | $T_{sat}$ | $T_{bot}$ | COOLING RATE | TIME | MODES OF OBSERVAT. | ONSET OF CONVECT. |
|---|---|---|---|---|---|---|---|
| 489-12(end) | Kbr(100) | 53° | 51–40° C. | 0.42° C./hr | 45 hr | S, I, s | none obs. |
| 489-55 | " | " | 55–25 | " | 80 | S, I, s | " |
| 233-53 | " | " | 53–31 | " | 50 | CM | |
| 233-63 | " | " | 51–30 | " | 50 | SM | 48° C. |
| 233-81 | " | " | 51–31 | " | 50 | SM(overexposed) | a lot at end |
| 233-86(end) | " | " | 53–34 | " | 40 | SM, I (burnout) | a lot at end |
| 948-19 | " | " | 53–36 | 0.083 | 264 | CM | |
| 948-50 | " | " | 53–39 | " | 172 | SM | none obs. |
| 948-92 | KDP(001) | 47 | 48–34 | " | 165 | none | |

| EXPERIMENT # | TOTAL GROWTH | INTERFACE PROFILE | SURFACE TEXTURE | DENSITY OF INCLUSIONS | LAYERS |
|---|---|---|---|---|---|
| 489-12(end) | 0.4 mm | convex[b] | fairly smooth | opaque | yes |
| 489-55 | 2.9 | " | rough | opq/clear/cellular | " |
| 233-53 | 1.1[c] | " | stepped | opaque | " |
| 233-63 | 1.4 | " | fairly smooth | opaque | " |
| 233-81 | 1.0 | slightly convex | fairly smooth | cloudy | " |
| 233-86(end) | 1.3 | double bow[b] | smooth, pitted | opaque | no[d] |
| 948-19 | 0.8 | sl. dbl. bow | smooth | opaque | " |
| 948-50 | 0.9 | sl. dbl. bow | smooth | opaque | " |

TABLE II-continued

| Gradient mode experiments[a] | | | | | |
|---|---|---|---|---|---|
| 948-92 | 0.2 | slightly convex | fairly smooth[e] | cloudy | N.A. |

NOTES:
[a]All experiments were carried out in the UGC3 cell with the top temperature at 80° C. throughout.
[b]Convex or bowed profile suggests stable low-velocity convection cells.
[c]Total growth on top and bottom of seed crystal.
[d]Layering not observed in inclusion structure but may be revealed by irradiation coloring.
[e]Sharp (101) facet observed along edges of crystal.

The above description presents the best mode contemplated in carrying out the present invention. This invention is, however, susceptible to modifications and alternate constructions from the embodiments shown in the drawing and described above. Consequently, it is not the intention to limit the invention to the particular embodiments disclosed. On the contrary, the invention is to cover all modifications and alternate constructions following within the spirit and scope of the invention as expressed in the appended claims.

What is claimed is:

1. A method of growing in a gravitational field a macroscopic crystal from a solution including the material from which the crystal is made and a solvent for the material, comprising:
   (a) holding the solution in a chamber which is relatively thin, this thin dimension being generally perpendicular to the vertical;
   (b) disposing in the chamber at either end a substrate crystal from which the crystal grows; and
   (c) controlling the temperature conditions of the solution so that the crystal forms, and as the crystal forms, the effect of buoyant convection within the solution is minimized.

2. The method of claim 1 wherein the substrate crystal is at the upper end of the chamber and the temperature of the solution is controlled so that said temperature remains essentially isothermal and there is essentially no thermal gradient established in the solution as the crystal forms.

3. The method of claim 1 wherein the substrate crystal is at the lower end of the chamber and the temperature of the solution is controlled so that a differential in temperature throughout the solution is provided which produces a positive thermal gradient within the chamber.

4. The method of claim 1 wherein the cooling rate of the solution is less than 1° C. per hour.

5. The method of claim 1 wherein the chamber has a boxlike internal configuration.

6. The method of claim 5 wherein the thin dimension of the chamber is not greater than about 8 millimeters.

7. A method of growing in a gravitational field a macroscopic crystal from a solution including the material from which the crystal is made and a solvent for this material, comprising:
   (a) holding the solution in a vertical chamber which is relatively thin, this thin dimension being generally perpendicular to the vertical;
   (b) disposing in the upper end of the chamber a substrate crystal so that the overall growth is downwardly in a vertical direction; and
   (c) controlling the temperature of the solution to cool the solution so that as the crystal forms the temperature of the solution remains essentially isothermal and there is essentially no loss of heat from the solution.

8. A method of growing in a gravitational field a macroscopic crystal from a solution including the material from which the crystal is made and a solvent for this material, comprising:
   (a) holding the solution in a vertical chamber which is relatively thin, this thin dimension being generally perpendicular to the vertical;
   (b) disposing in said chamber near its lower end a crystal substrate so that as the crystal forms, its overall growth is generally upwardly and in a vertical direction;
   (c) cooling the solution at the interface between the growing crystal substrate and the solution so that the macroscopic crystal grows from the crystal substrate; and
   (d) controlling the temperature of the solution as the macroscopic crystal forms to provide a differential in temperature which produces a positive thermal gradient within the chamber.

9. The method of either claim 7 or 8 wherein the chamber has a boxlike internal configuration.

10. The method of claim 9 wherein the thin dimension of the chamber is not greater than about 8 millimeters.

* * * * *